(12) United States Patent
Sato

(10) Patent No.: US 6,770,908 B2
(45) Date of Patent: Aug. 3, 2004

(54) ELECTRO-OPTICAL DEVICE, SUBSTRATE FOR ELECTRO-OPTICAL DEVICE, AND PROJECTING TYPE DISPLAY DEVICE

(75) Inventor: Takashi Sato, Chino (JP)

(73) Assignee: Seiko Epson Corporation, Tokyo (JP)

( * ) Notice: Subject to any disclaimer, the term of this patent is extended or adjusted under 35 U.S.C. 154(b) by 43 days.

(21) Appl. No.: 09/906,074

(22) Filed: Jul. 17, 2001

(65) Prior Publication Data
US 2002/0014627 A1 Feb. 7, 2002

(30) Foreign Application Priority Data

Jul. 26, 2000 (JP) .......................................... 2000-225419
May 9, 2001 (JP) .......................................... 2001-138816

(51) Int. Cl.[7] .................... H01L 29/04; H01L 31/036; H01L 31/0376; H01L 31/20
(52) U.S. Cl. ............................ 257/59; 257/66; 257/72; 257/98; 257/294
(58) Field of Search ............................ 257/59, 66, 72, 257/98, 294; 349/42, 43

(56) References Cited

U.S. PATENT DOCUMENTS

| | | | | |
|---|---|---|---|---|
| 5,745,202 A | | 4/1998 | Yamauchi et al. | ........... 349/110 |
| 5,990,491 A | * | 11/1999 | Zhang | ........................... 257/57 |
| 6,171,901 B1 | * | 1/2001 | Blair et al. | .................. 438/250 |
| 6,303,963 B1 | * | 10/2001 | Ohtani et al. | ................ 257/350 |
| 6,636,192 B1 | | 10/2003 | Saitoh | ........................... 345/87 |
| 6,654,083 B1 | | 11/2003 | Toda et al. | .................. 349/110 |

FOREIGN PATENT DOCUMENTS

| | | |
|---|---|---|
| JP | 03-269415 | 12/1991 |
| JP | 4-001728 A | 1/1992 |
| JP | 4-133035 A | 5/1992 |
| JP | 6-331975 A | 12/1994 |
| JP | A-9-33944 | 2/1997 |
| JP | 9-171196 A | 6/1997 |
| JP | 9-318935 A | 12/1997 |
| JP | 1090716 A | 4/1998 |
| JP | 10-206889 A | 8/1998 |
| JP | 2000-010121 A | 1/2000 |
| JP | A 2000-269473 | 9/2000 |
| KR | 1999-29517 | 4/1999 |
| KR | 2001-24964 | 3/2001 |

* cited by examiner

*Primary Examiner*—Thien F Tran
(74) *Attorney, Agent, or Firm*—Oliff & Berridge, PLC

(57) ABSTRACT

An electro-optical device includes, on a TFT array substrate, pixel electrodes, TFTs connected to the pixel electrodes, a shading layer that covers at least the channel regions of the TFTs, and a light absorption layer interposed between the shading layer and the TFTs and mainly formed a material which mainly forms the channel regions. The light absorption layer suppresses occurrence of inner surface reflection and multiple reflection on the inner surface of the shading layer facing the TFTs.

29 Claims, 10 Drawing Sheets

ELECTRO-OPTICAL DEVICE, SUBSTRATE FOR ELECTRO-OPTICAL DEVICE, AND PROJECTING TYPE DISPLAY DEVICE

BACKGROUND OF THE INVENTION

1. Field of Invention

The present invention relates to the technical field of an electro-optical device of an active matrix drive system, and more particularly, to the technical filed of an electro-optical device of a type having pixel switching thin film transistors (hereinafter, referred to as TFTs) disposed in a laminated layer structure on a substrate.

2. Description of Related Art

In electro-optical devices of a TFT active matrix drive system, when incident light beams are irradiated on the channel region of a pixel switching TFT associated with each pixel, a current is generated thereto by the excitation caused by the light beams so that the characteristics of the TFT are changed. In particular, in electro-optical devices used for light bulbs of projectors, since incident light beams have high intensity, it is important to shade light beams incident on the channel region and its peripheral region of a TFT. Thus, the channel region and its peripheral region are conventionally shaded by a shading film disposed at a confronting substrate to prescribe the opening region of each pixel or by a data line passing on the TFT and formed of a metal film of Al or the like. Japanese Unexamined Patent Application Publication No. 9-33944 discloses a technology for reducing light beams incident on a channel region by a shading film formed of a-Si (amorphous silicon) having a large refractive index. Further, a shading film formed of, for example, a metal having a high melting point, is sometimes disposed on a TFT array substrate at a position facing a pixel switching TFT (that is, below the TFT). The shading film also disposed below the TFT can prevent light beams reflected on the back surface of the TFT array substrate from being incident on the TFT of the electro-optical device as well as can prevent projected light beams, which have passed through a prism and the like when one optical system is constructed by a combination of a plurality of electro-optical devices through the prism and the like, from being incident on the TFT of the electro-optical device.

SUMMARY OF THE INVENTION

However, the above-mentioned various types of the shading technologies have the following problems. That is, first, according to the technology for forming the shading film on the confronting substrate and on the TFT array substrate, the shading film is considerably separated from the channel region through, for example, a liquid crystal layer, electrodes, an interlayer insulation film when observed three-dimensionally, and light beams incident obliquely between the shading film and the channel region cannot be sufficiently shaded. In particular, in small electro-optical devices used as light bulbs of projectors, light beams incident thereon are obtained by stopping light beams projected from a light source through a lens and that contain an obliquely incident light component in an amount which cannot be disregarded. Thus, it is a problem in practical use that such obliquely incident light beams are not sufficiently shaded.

In addition to the above problems, after light beams, which have traveled into an electro-optical device from a region having no shading film, and are reflected by a shading film and the inner surface of a data line (that is, the surface thereof facing a channel region), the reflected light beams, or light beams, which are created when the reflected light beams are further reflected by the shading film and the inner surface of the data line a plurality of times (hereinafter, referred to as "multipath-reflected light beams"), may finally reach the channel region of a TFT. Further, according to the technology for shading light beams by a data line, it is basically difficult for the data line to sufficiently shade light beams, because the data line is formed in a striped shape which extends perpendicularly to a scanning line when observed on a plan view. It is also necessary to dispose a thick interlayer insulation film therebetween in such a degree that the adverse affect of the capacitance coupling between the data line and the channel region can be disregarded.

Further, according to the technology described in Japanese Unexamined Patent Application Publication No. 9-33944, a relatively thick interlayer insulation film must be laminated between a gate electrode and an a-Si film to reduce the adverse affect of the capacitance coupling therebetween to form an a-Si film on a gate line. As a result, the additional formation of the a-Si film, the interlayer insulation film, and the like makes a laminated structure complex and increases its size. It is also difficult to sufficiently shade obliquely incident light beams and inner-surface reflected light beams. In particular, since electro-optical devices are miniaturized and the pixel pitches thereof are greatly narrowed to cope with a recent requirement for enhancing the quality of a displayed image, it is more difficult to sufficiently shade light beams by the various types of the above-mentioned conventional technologies. Accordingly, a problem arises in that the quality of a displayed image is lowered by flickering of the image and the like caused by the change of the characteristics of TFTs.

It should be noted that, while it is contemplated to increase a region where a shading film is formed to increase the light resistant property, an increase in the region where the shading film is formed causes a problem in that it is fundamentally difficult to increase the opening ratio of each pixel in order to enhance the brightness of a displayed image.

It is therefore an object of the present invention, which was made in view of the above-mentioned problems, to provide an electro-optical device which is excellent in its light resistant property, and which has a relatively large opening ratio of each pixel and can display an image of high quality.

To solve the above problems, an electro-optical device of the present invention includes a pair of substrates, an electro-optical substance interposed between the pair of substrates, pixel electrodes formed on one of the pair of substrates, thin film transistors connected to the pixel electrodes, a shading layer that covers at least the channel regions of the thin film transistors, and a light absorption layer interposed between the shading layer and the thin film transistors.

According to the electro-optical device of the present invention, at least the channel regions of the thin film transistors connected to the pixel electrodes are shaded by the shading layer.

When a shading layer formed of a metal film having a shading property such as an Al (aluminum) film, a Cr (chromium) film, or the like is generally used, light beams incident on the thin film transistors from a side where the shading layer is disposed basically can be sufficiently shaded by reflecting the light beams by the surface, which does not face the thin film transistors, of the shading layer (that is, by the outer surface of the shading layer in the electro-optical device). More specifically, when the shading layer is disposed on a side where light beams (for example, projected light beams when the electro-optical device is applied to a projector) are incident on the thin film transistors, the incident light beams can be shaded by the outer surface of the shading layer. Otherwise, when the shading layer is disposed on a side from which incident light beams emerge with respect to the thin film transistors, return light beams (for example, light beams reflected on a back surface when the electro-optical device is applied to the projector, light beams passing through a composite optical system from other light bulb when a plurality of electro-optical devices are used in combination as a light bulb as in a case in which the electro-optical devices are applied to a double-panel type projector) can be shaded by the outer surface of the shading layer. However, return light beams, which pass aside the thin film transistors from an opposite side of the shading layer and are oblique to the substrate (for example, when the shading layer is disposed to the side of the thin film transistors on which light beams are incident) or incident light beams (for example, when the shading layer is disposed to the side of the thin film transistors from which light beams emerge) are at least partly reflected by the front surface, which faces the thin film transistors, of the shading layer (that is, the inner surface of the shading layer in the electro-optical device). Thus, inner-surface-reflected light beams are generated between the shading layer and the thin film transistors by these oblique incident light beams and return light beams reflected on the inner surface of the shading layer. Further, multiple reflection is also caused when the inner-surface-reflected light beams are reflected by another film. Accordingly, even if the shading layer is simply disposed at the thin film transistors, inner-surface-reflected light beams and multipath-reflected light beams are caused by light beams reflected by the inner surface of the shading layer and finally incident on the thin film transistors, regardless of the size of the shading layer and the location where the shading layer is disposed. As a result, the characteristics of the thin film transistors are deteriorated by these internally-reflected light beams and multipath-reflected light beams.

According to the present invention, however, light beams, which pass aside the thin film transistors from the opposite side of the shading layer and tend to obliquely reach the inner surface of the shading layer, and light beams, which are reflected by the inner surface of the shading layer, are absorbed by the light absorption layer interposed between the shading layer and the thin film transistors. As a result, when the shading layer formed of the metal film having a high reflectance, such as the Al film, the Cr film is disposed and sufficiently shades light beams incident on the outer surface of the shading layer, the transistor characteristics can be effectively prevented from being deteriorated by light leakage. Further, reduction of a contrast ratio caused by light beams passing through an image display region can be effectively prevented by the shading layer. On the other hand, since the inner-surface-reflected light beams and the multipath-reflected light beams are absorbed by the light absorption layer, the deterioration of the transistor characteristics caused by the light leakage can be more effectively reduced or prevented. Moreover, light beams can be shaded and absorbed at a location relatively near to the thin film transistors as compared with a case in which they are shaded and absorbed by, for example, a shading layer disposed to a conventional confronting substrate, which can enhance a shading performance while avoiding an unnecessarily increase in a region where the shading layer is formed (that is, without unnecessarily reducing the non-opening region of each pixel).

As a result, an electro-optical device can be realized in which respective pixels have a high opening ratio. Also, deterioration of the characteristics of thin film transistors due to light leakage can be reduced by a high light resistant property. An electron optical device can be provided, which has a high contrast ratio, and which can display an image of high quality.

It should be noted that the interlayer distance between the shading layer and the light absorption layer in the present invention may be small by interposing no film or a very thin insulation film, or the like therebetween, or may be large by interposing a somewhat thick interlayer insulation film therebetween. As described below, however, it is advantageous to reduce the interlayer distance between the shading layer and the light absorption layer from a view point of constructing a storage capacitor by using the shading layer and the light absorption layer as a pair of capacitance electrodes, and from a view point of enabling heat generated by the light absorption layer to escape, through the shading layer.

In one aspect of the electro-optical device of the present invention, the light absorption layer is mainly formed of a material which mainly forms the channel regions of the thin film transistors. The light absorption layer is formed of a polysilicon film mainly formed of, for example, silicon and containing P, B, or As doped thereto to make the silicon conductive.

Further, the channels of the thin film transistors are formed of polysilicon mainly including silicon. The polysilicon is doped with a slight amount of B, P, As or the like to control the threshold voltage Vth of the thin film transistors, or is not doped with any material.

Further, amorphous silicon or single crystal silicon may be used for the channels and the light absorption layer in place of the polysilicon.

In another aspect of the electro-optical device of the present invention, the light absorption layer is formed of a silicon film.

According to this aspect, light beams, which tend to reach the inner surface of the shading layer, and light beams, which are reflected by the inner surface, can be absorbed by the light absorption layer formed of the silicon film. Therefore, the occurrence of the inner-surface-reflected light beams and the multipath-reflected light beams can be effectively reduced or prevented. In particular, when the polysilicon film is employed as a semiconductor layer serving as the channel regions of the thin film transistors, the light absorption layer has a light absorbing property that is similar to, or the same as, the light absorbing property (frequency depending property and the like) in the channel regions. Accordingly, the light absorption layer formed of the silicon film is very advantageous because light beams including a light component, which becomes a cause of light leakage when absorbed by the channel regions, can be absorbed and removed by the light absorption layer.

In another aspect of the electro-optical device of the present invention, the shading layer is formed of a film containing metal.

According to this aspect, incident light beams and return light beams can be sufficiently shaded by the shading layer formed of the film containing metal. At this time, since internally-reflected light beams and multipath-reflected light beams can be particularly absorbed and removed by the light absorption layer, a film containing metal having a very high reflectance, such as an Al film, and the like, can be employed. It should be noted that exemplified as the film containing metal, in addition to the Al film, is a film formed of single metal, alloy, metal silicide, polysilicide, a laminated film thereof, and the like, containing at least one of high melting point metals, for example, Ti (titanium), Cr (chromium), W (tungsten), Ta (tantalum), Mo (molybdenum), Pb (lead), and the like.

In another aspect of the electro-optical device of the present invention, the shading layer is disposed above the thin film transistors on the substrate.

According to this aspect, incident light beams can be shaded by the outer surface of the shading layer disposed above the thin film transistors. Then, since return light beams, which tend to reach the inner surface of the shading layer, and light beams, which are reflected by the inner surface thereof, are absorbed and removed by the light absorption layer, the deterioration of the characteristics of the thin film transistors due to the internally-reflected light beams and the multipath-reflected light beams resulting from the reflection of light beams on the inner surface of the shading layer can be reduced or prevented by the shading layer and the light absorption layer.

In the aspect in which the shading layer is disposed on the upper side, the shading layer may be formed of data lines.

With this arrangement, when data lines composed of an Al film, or the like, are provided with a function as a shading layer in addition to a function as wiring, it is possible to prevent a laminated structure from becoming complex by additionally forming a dedicated shading layer. Accordingly, this arrangement is very advantageous by simply arranging the electro-optical device, and simplifies a manufacturing process thereof.

In the aspect in which the shading layer is disposed on the upper side, the shading layer may be formed of capacitance lines interposed between the data lines and the thin film transistors, and the light absorption layer may be formed of capacitance electrodes disposed in confrontation with the capacitance lines through a dielectric film and separated in an island shape for each pixel.

With this arrangement, the provision of the function as the shading layer with the capacitance lines formed of the metal film, the polysilicon film, or the like, in addition to the function as the wiring, as well as the provision of the function as the light absorption layer with the capacitance electrodes formed of the polysilicon film, or the like, in addition to the function as the electrodes, prevents the laminated structure from becoming complex by additionally forming a dedicated shading layer and a dedicated light absorption layer. Accordingly, this arrangement is very advantageous by simply arranging the electro-optical device, and simplifies a manufacturing process thereof.

In the aspect in which the shading layer is disposed on the upper side, the shading film may be formed of a plurality of data lines connected to the thin film transistors and extending in a first direction, respectively, and a plurality of capacitance lines connected to the pixel electrodes and extending in a second direction intersecting the first direction, respectively.

With this arrangement, the provision of the function as a part of the shading layer with the data lines formed of the Al film, or the like, in addition to the function as the wiring, as well as the provision of the function as a part the shading layer with the capacitance lines formed of the metal film, polysilicon film, or the like, in addition to the function as the wiring, prevents the laminated structure from becoming complex by additionally forming a dedicated shading layer. In particular, when the data lines are used as the shading layer in the direction along the data lines, and the capacitance lines are used as the shading layer in the direction along the capacitance lines or scanning lines, no waste is caused in the layout of wiring. Accordingly, this arrangement is very advantageous by simply arranging the electro-optical device, and simplifies a manufacturing process thereof.

Otherwise, according to this aspect in which the shading layer is disposed on the upper side, the shading layer may be formed of one layer of capacitance lines interposed between data lines and the thin film transistors, and having a multi-layer structure, and the light absorption layer may be formed of another layer of the capacitance lines that is located nearer to the thin film transistors than the one layer.

With this arrangement, both a shading function and a light absorbing function can be provided by the capacitance lines, which have the multi-layer structure, including both the shading layer and the light absorption layer. In addition to the above, it is also possible to enable heat generated in the light absorption layer when it absorbs light beams to escape through the shading layer.

Further, in various situations in which the capacitance lines are provided as described above, the capacitance lines may be formed in a striped shape extending in a direction intersecting the data lines in an image display region, and may be connected to a constant potential source located in a peripheral region located in the vicinity of the image display region.

With this arrangement, the capacitance lines can be set to a constant potential in the peripheral region, so that the constant potential portion of the capacitance lines, that is disposed facing the respective capacitance electrodes in the image display region, can suitably function as fixed potential side capacitance electrodes constituting a storage capacitor. Therefore, the performance of the storage capacitor can be enhanced. The constant potential source may be a constant potential source, such as a positive power supply or a negative power supply, which is supplied to a periphery drive circuit to drive the thin film transistors, or a constant potential source supplied to the confronting electrodes of the confronting substrate.

When the capacitance lines are connected to the constant potential source as described above, the capacitance lines may be connected to each other in the peripheral region, and may be connected to the constant potential source as a whole through one or a plurality of contacts.

With this arrangement, in the image display region, the plurality of striped-shaped capacitance lines can be connected to the constant potential as a whole in the peripheral region through the one or plurality of contacts (for example, the contacts disposed at the four corners of the substrate).

Otherwise, when the capacitance lines are connected to the constant potential source as described above, the capacitance lines may be connected to each other in the peripheral region, and may be redundantly connected to the constant potential source as a whole through a plurality of contacts.

With this arrangement, in the image display region, the plurality of striped-shaped capacitance lines can be stably and reliably connected to the constant potential in the peripheral region through the plurality of contacts disposed redundantly.

Further, according to this aspect in which the shading layer is disposed on the upper side as described above, another shading layer may further be provided, which is disposed below the thin film transistors on the substrate, to cover at least the channel regions of the thin film transistors.

With this arrangement, return light beams, traveling from the lower side of the thin film transistors, can be shaded by the other shading film so that the thin film transistors can be shaded from the upper and lower sides thereof. At this time, internally-reflected light beams and multipath-reflected light beams, which particularly tend to be created between the two shading films, can be absorbed and shaded by the light absorption layer. The other shading film may be formed of single metal, alloy, metal silicide, poly-silicide, a laminated film thereof, or the like, containing at least one of high melting point metals, for example, Ti, Cr, W, Ta, Mo, Pb.

In this case, the other light absorption layer may be interposed between the other shading layer and the thin film transistors. The other light absorption layer being mainly formed of a material (for example, silicon or polysilicon) which mainly forms the channel regions of the thin film transistors.

With this arrangement, the internally-reflected light beams and the multipath-reflected light beams, which tend to be created between the two shading films, can more strongly be absorbed and shaded by the two light absorption layers.

In another aspect of the electro-optical device of the present invention, the shading layer is disposed below the thin film transistors on the substrate.

According to this aspect, return light beams can be shaded by the outer surface of the shading layer disposed below the thin film transistors. Then, since incident light beams, which tend to reach the inner surface of the shading layer, and light beams, which are reflected by the inner surface thereof, are absorbed and removed by the light absorption layer, the deterioration of the characteristics of the thin film transistors due to the internally-reflected light beams and the multipath-reflected light beams resulting from the reflection of light beams on the inner surface of the shading layer can be reduced or prevented by the shading layer and the light absorption layer. The shading film disposed below the thin film transistors may be formed of single metal, alloy, metal silicide, poly-silicide, a laminated film thereof, or the like, containing at least one of high melting point metals, for example, Ti, Cr, W, Ta, Mo, Pb.

In another aspect of the electro-optical device of the present invention, the light absorption layer includes a portion that includes an intermediate conductor layer that transits and connects the pixel electrodes or the data lines to the thin film transistors.

According to this aspect, the provision of the function as a part of the light absorption layer with the intermediate conductor layer formed of the polysilicon film, or the like, in addition to the transiting and connecting function, can prevent the laminated structure from becoming complex by additionally forming a dedicated light absorption layer. Accordingly, this arrangement is advantageous by simply arranging the electro-optical device, and simplifies a manufacturing process thereof. It should be noted that when the intermediation and connection are executed by making use of the intermediate conductor layer, the connection between the thin film transistors and the pixel electrodes, and between the thin film transistors and the data lines, can be excellently performed through at least two series contact holes, each having a relatively small diameter, while avoiding a technical difficulty of executing the connection through one contact hole, even if the distance between the thin film transistors and the pixel electrodes, and the distance between the thin film transistors and the data lines, is long.

In another aspect of the electro-optical device of the present invention, the shading layer has a heat conductivity that is higher than that of the light absorption layer.

According to this aspect, it is possible for heat generated in the light absorption layer when it absorbs light beams through the shading layer having the high heat conductivity to escape. That is, the quantity of heat transmitted from the light absorption layer to the thin film transistors can be reduced, whereby heat leakage generated in the thin film transistors can be reduced. As a result, the transistor characteristics can be greatly enhanced by reducing both the light leakage and the heat leakage by the shading film and the light absorption layer.

In this aspect, the interlayer distance between the thin film transistors and the light absorption layer may be larger than that between the light absorption layer and the shading layer.

With this arrangement, it is possible to more effectively escape heat generated in the light absorption layer, when it absorbs light beams through the shading layer disposed in the vicinity of the light absorption layer. That is, the quantity of heat transmitted to the thin film transistors can be reduced by the distance of the light absorption layer disposed farther. An interlayer insulation film or the like is interposed between the thin film transistors and the light absorption layer, and between the light absorption layer and the shading layer.

In another aspect of the electro-optical device of the present invention, the shading layer is laminated on the light absorption layer through an insulation film, and is formed slightly larger than the light absorption layer when observed in plan view.

According to this aspect, light beams incident on the outer surface of the shading layer, which is slightly larger than the light absorption layer, can be shaded by the shading film, and, at the same time, light beams, incident on the inner surface of the shading layer, can be absorbed by the light absorption layer, which is slightly smaller than the shading layer.

In another aspect of the present invention, an electro-optical device includes a pair of substrates, an electro-optical substance interposed between the pair of substrates, a pixel electrodes formed on one of the pair of substrates thin film transistors connected to the pixel electrodes, a first shading layer that covers at least the channel regions of the thin film transistors, and a first light absorption layer facing the first shading layer through the thin film transistors.

According to this aspect, the light beams incident on the thin film transistors are shaded by the first shading layer and absorbed by the first light absorption layer, so that the light beams are prevented from being reflected to the thin film transistors.

Further, it is preferable that the first shading layer be disposed on a light incident side with respect to the thin film transistors.

According to this aspect, the first shading layer can prevent light beams from being directly irradiated to the thin film transistors.

Further, it is preferable that a second light absorption layer be interposed between the first shading layer and the thin film transistors.

According to this aspect, the light beams directed to the thin film transistor side of the first shading layer by internal reflection and the like can be absorbed by the second light absorption layer.

Further, it is preferable that a second shading layer be disposed on a side opposite to the first light absorption layer with respect to the thin film transistors.

According to this aspect, the light beams directed to the thin film transistors by internal reflection and the like can be shaded by the second shading layer.

Further, the second shading layer may be formed in a region inside of the first light absorption layer.

According to this aspect, even if strong light beams are obliquely irradiated to the first light absorption layer extending from the second shading layer and leak from the first light absorption layer, the light beams can escape to the exterior.

Further, the second shading layer is formed in a region inside of the first shading layer.

According to this aspect, the second shading layer can avoid oblique light beams.

In another aspect of the electro-optical device the present invention, the electro-optical device includes a pair of substrates, an electro-optical substance interposed between the pair of substrates, pixel electrodes formed on one of the pair of substrates, thin film transistors connected to the pixel electrodes, a first light absorption layer that covers at least the channel regions of the thin film transistors, and a second light absorption layer facing the first light absorption layer through the thin film transistors.

According to this aspect, obliquely incident light beams in particular can be absorbed by the first and second light absorption layers, which can reduce light beams irradiated to the thin film transistors.

Further, light transmitting insulation films are interposed among the pixel electrodes, the thin film transistors, and the first light absorption layer, respectively.

In an aspect of a projecting type display device of the present invention, the projecting type display device includes a light source, light bulbs, each including an electro-optical device, light conductors that introduce light beams emitted from the light source to the light bulbs, and a projecting optical member that projects light beams modulated by the light bulbs.

According to this aspect, since it is difficult for light beams to enter the thin film transistors in the electro-optical device, an image of high quality can be projected.

In an aspect of a substrate for electro-optical device of the present invention, the substrate includes pixel electrodes, thin film transistors connected to the pixel electrodes, a shading layer that covers at least the channel regions of the thin film transistors, and a light absorption layer interposed between the shading layer and the thin film transistors.

In an aspect of the substrate for electro-optical device of the present invention, the substrate includes pixel electrodes, thin film transistors connected to the pixel electrodes, a first light absorption layer that covers at least the channel regions of the thin film transistors, and a second light absorption layer facing the first light absorption layer through the thin film transistors.

In an aspect of the substrate for electro-optical device of the present invention, the substrate includes pixel electrodes, thin film transistors connected to the pixel electrodes, a first light absorption layer that covers at least the channel regions of the thin film transistors, and a second light absorption layer facing the first light absorption layer through the thin film transistors.

The thin film transistors of the present invention may be of a so-called top gate type in which gate electrodes formed of a part of scanning lines are located above channel regions, or may be of a bottom type in which gate electrodes formed of a part of scanning lines are located below channel regions. Further, the interlayer positions of pixel electrodes may be located above or below scanning lines on a substrate.

DETAILED DESCRIPTION OF PREFERRED EMBODIMENTS

Embodiments of the present invention will be described below based on the drawings. In the following embodiments, an electro-optical device of the present invention is applied to a liquid crystal device.

Figure 1:
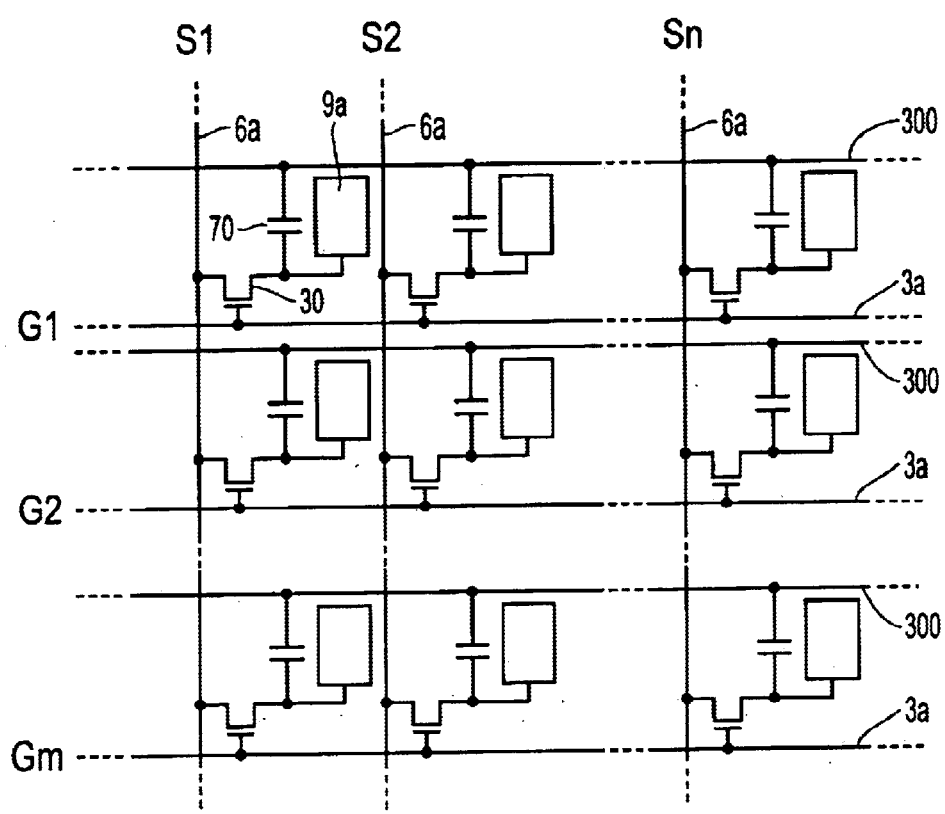
FIG. 1 is a schematic of an equivalent circuit including various elements, wiring, and the like disposed at a plurality of matrix-shaped pixels constituting an image display region in an electro-optical device of an embodiment of the present invention.
Figure 2:
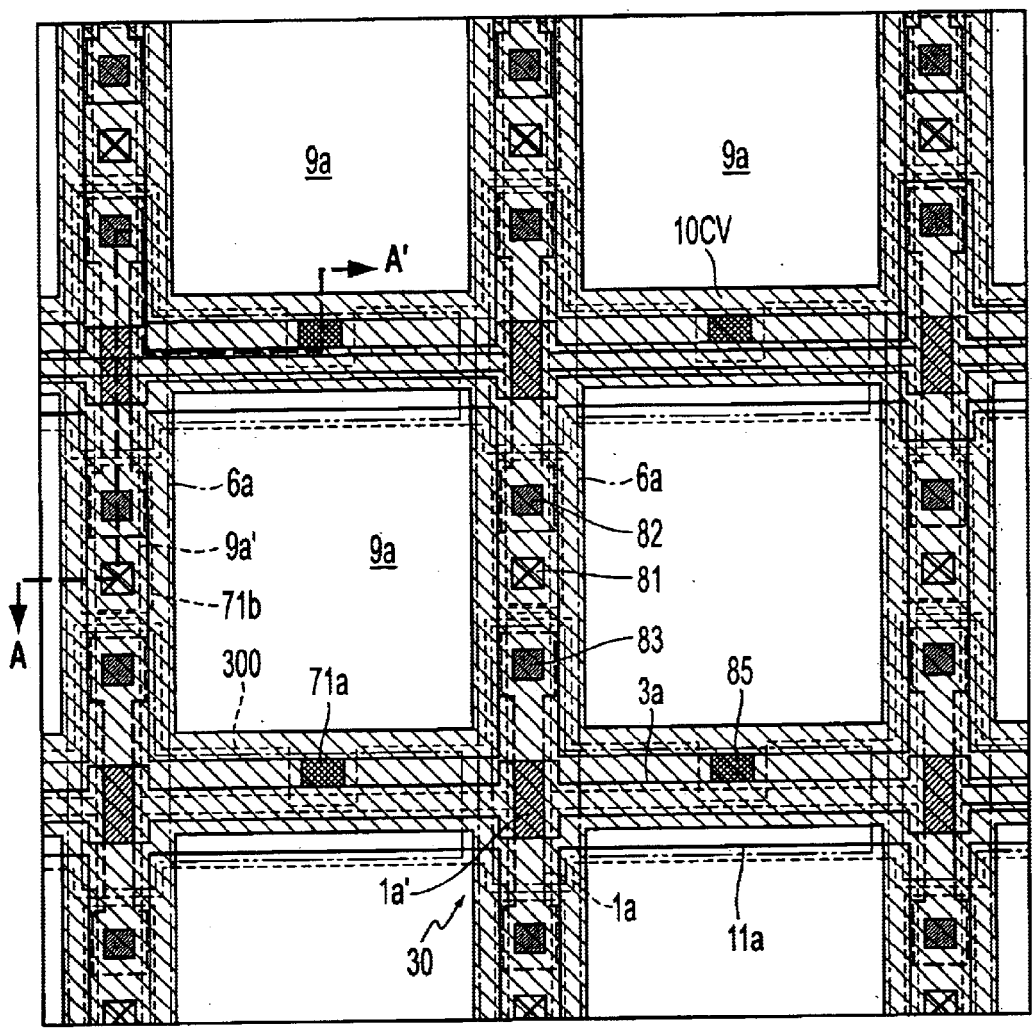
FIG. 2 is a plan view of a plurality of adjacent pixel groups of a TFT array substrate, on which data lines, scanning lines, pixel electrodes, and the like are formed, in the electro-optical device of the embodiment.
Figure 3:
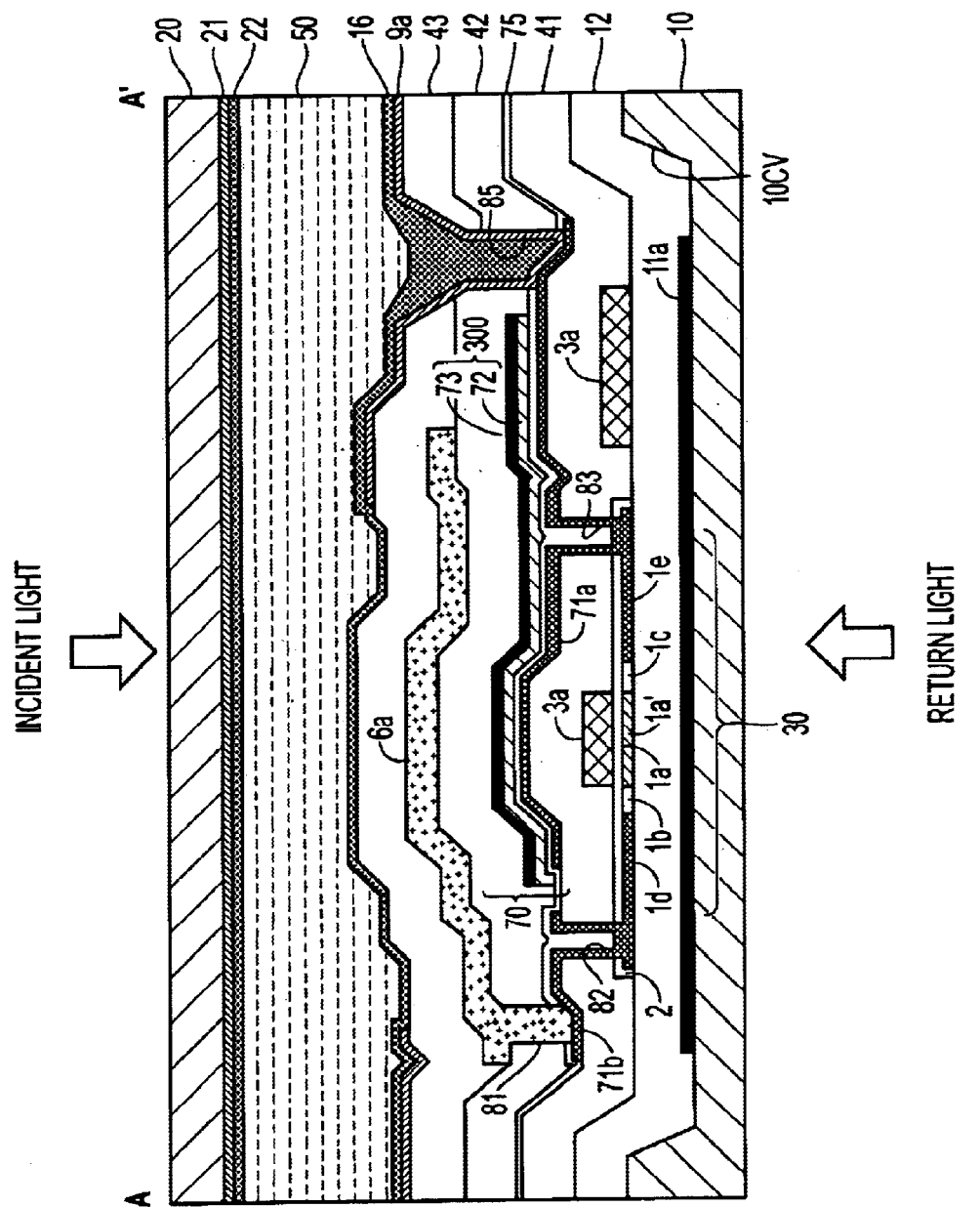
FIG. 3 is a sectional view taken along plane A–A' of FIG. 2.

First, an arrangement of the electro-optical device in the embodiments of the present invention will be described with reference to FIGS. 1 to 3. FIG. 1 is a schematic of an equivalent circuit including various elements, wiring, and the like disposed at a plurality of matrix-shaped pixels constituting the image display region of the electro-optical device. FIG. 2 is a plan view of a plurality of adjacent pixel groups of a TFT array substrate on which data lines, scanning lines, pixel electrodes, and the like are formed. FIG. 3 is a sectional view taken along plane A–A' of FIG. 2. In FIG.

3, respective layers and components have a different reduction ratio so that they are shown in a size which can be recognized on the figure.

In FIG. 1, a pixel electrode 9a and a TFT 30 that controls the switching of the pixel electrode 9a are formed at each of a plurality of pixels formed in a matrix shape to constitute the image display region of the electro-optical device in this embodiment. A data line 6a to which an image signal is supplied is electrically connected to the source of the TFT 30. Image signals S1, S2, . . . Sn to be written to the data lines 6a may be supplied in this order in the sequence of the data lines 6a or may be supplied to the plurality of adjacent data lines 6a in each group. Further, scanning lines 3a are electrically connected to the gates of TFTs 30 and pulsewise scanning signals G1, G2, . . . , Gm are sequentially applied to the scanning lines 3a in this order in the sequence of the scanning line 3a. The pixel electrodes 9a are electrically connected to the drains of the TFTs 30, and the image signals S1, S2, . . . Sn supplied from the data lines 6a are written to the pixel electrodes 9a at predetermined timing by turning off the TFTs 30 acting as switching elements for a predetermined period of time. The image signals S1, S2, . . . Sn of a predetermined level, written to liquid crystal as an example of an electro-optical substance through the pixel electrode 9a, are maintained between the pixel electrodes 9a and the confronting electrodes (to be described later) formed on a confronting substrate (to be described later) for a predetermined period. The liquid crystal modulates light beams and permits a gradation display by changing the orientation and order of aggregated modules based on the level of a voltage applied thereto. When a normally-white mode is employed, the transmittance of incident light beams is reduced in accordance with a voltage applied in a unit of the respective pixels, whereas, when a normally-black mode is employed, the transmittance of incident light beams is increased in accordance with a voltage applied in a unit of the respective pixels, so that light beams having a contrast in accordance with an image signal are emerged from the electro-optical device as a whole. Storage capacitors 70 are added in parallel with liquid crystal capacitors formed between the pixel electrodes 9a and the confronting electrodes to prevent leakage of the thus maintained image signal.

In FIG. 2, the plurality of transparent pixel electrodes 9a (the outline of each of which is shown by a dotted line portion 9a') are formed on the TFT array substrate of the electro-optical device, and the data lines 6a and the scanning lines 3a are disposed along the longitudinal and lateral interfaces of the pixel electrodes 9a.

Further, the scanning lines 3a are disposed so as to face the channel regions 1a', which are shown by oblique lines inclining upward in the right direction in the figure, of a semiconductor layer 1a, and the scanning lines 3a act as gate electrodes (in particular, in this embodiment, the scanning lines 3a are widened at portions where they act as the gate electrodes). As described above, the pixel switching TFTs 30, each of which has a scanning line 3a as a gate electrode in each channel region 1a' in confrontation therewith, are disposed at the positions where the scanning lines 3a intersect the data lines 6a.

As shown in FIGS. 2 and 3, in this embodiment, each capacitance line 300 has a multi-layer structure in which a first film 72, formed of a conductive polysilicon film, or the like, and a second film 73 formed of a metal silicide film or the like containing a high melting point metal, are laminated. Of these films, the second film 73 has a function as a shading layer to shade a TFT 30 from incident light beams on the upper side of the TFT 30, in addition to a function as the capacitance line 300 or a capacitance electrode of the storage capacitor 70 on the fixed potential side thereof. Further, the first film 72 has a function as a light absorbing layer interposed between the second film 73 as the shading layer and the TFT 30, in addition to the function as the capacitance line 300 or the fixed potential side capacitance electrode of the storage capacitor 70. In contrast, each transit layer 71a disposed facing each capacitance line 300 through a dielectric film 75 has a function as a light absorbing layer interposed between the second film 73 acting as the shading layer and the TFT 30, in addition to a function as the pixel potential side capacitance electrode of the storage capacitor 70, and further has a function as an intermediate conductor layer to transit and connecting the pixel electrodes 9a and the heavily doped drain regions 1e of the TFTs 30. This shading and light absorption will be described below in detail with reference to FIGS. 4 to 7. The first film 72 and the transit layer 71a acting as the light absorption layers are formed of a material such as a polysilicon film having a higher light absorption factor as compared with the second film 73 acting as the shading layer.

In this embodiment, the storage capacitor 70 is formed of the transit layer 71a, which acts as the pixel potential side capacitance electrode connected to the heavily doped drain region 1e of the TFT 30 (and the pixel electrode 9a), and a part of the capacitance line 300, which acts as the fixed potential side capacitance electrode, wherein the transit layer 71a and the part of the capacitance line 300 are disposed in confrontation with each other through the dielectric film 75.

Each capacitance line 300 extends along each scanning line 3a in a striped shape, and the portion thereof overlapping a TFT 30 projects upward and downward in FIG. 2. Then, a shading layer, which has a lattice shape when observed in plan view, are formed above the TFTs 30 on the TFT array substrate 10 in such an arrangement that the data lines 6a extending in a longitudinal direction in FIG. 2 intersect with the capacitance lines 300 extending in a lateral direction in FIG. 2. The shading layer prescribes the opening regions of the respective pixels.

In contrast, a lower shading film 11a is formed in a lattice shape under the TFTs 30 on the TFT array substrate 10.

In this embodiment, the region where the lattice-shaped lower shading film 11a is formed is located within the region where the upper shading layer (that is, the capacitance lines 300 and the data lines 6a) having the lattice shape likewise is formed (that is, the former region is formed slightly smaller than the latter region and the lower shading film 11a is formed narrower than the widths of the capacitance line 300 and the data lines 6a). Then, the channel regions 1a' of the TFTs 30, which include the portions where the lightly doped source regions 1b of the TFTs 30 are connected to the lightly doped drain regions 1c (that is, LDD regions) thereof, are located within the intersecting regions of the lattice-shaped lower shading film 11a.

The second film 73 and the lower shading film 11a, constituting an example of the shading layer, are formed of single metal, alloy, metal silicide, poly-silicide, a laminated film thereof, or the like containing at least one of high melting point metals, for example, Ti, Cr, W, Ta, Mo, Pb, and the like, respectively. Further, each capacitance line 300 containing the second film 73 has the multi-layer structure, and the first film 72 thereof is formed of the conductive polysilicon film. While it is not necessary to form the second film 73 of a conductive material, if not only the first film 72 but also the second film 73 are formed of a conductive film, the resistance of the capacitance line 300 can be more reduced.

Further, in FIG. 3, each of the dielectric films 75 interposed between a transit layer 71a and a capacitance line 300, acting as the capacitance electrode, is composed of a silicon oxide film such as a relatively thin HTO film, LTO film or the like having a film thickness of, for example, 5 to 200 nm, a silicon nitride film, or the like. From a viewpoint of increasing the capacitance of each storage capacitor 70, it is preferable that the dielectric film 75 be as thin as possible as long as the reliability thereof can be sufficiently obtained.

Each of the first films 72, which acts as not only the light absorption layer but also constitutes a portion of each capacitance line 300, is formed of, for example, a polysilicon film having a film thickness of about 150 nm. Further, the second film 73, which acts not only as the light absorption layer but also constitutes another portion of each capacitance line 300, is formed of a tungsten silicide film having a film thickness of, for example, about 150 nm. Since the first film 72, disposed on the side which is in contact with the dielectric film 75, is formed of the polysilicon film and the transit layer 71a, which is in contact with the dielectric film 75, is formed of the polysilicon film, the deterioration of the dielectric film 75 can be prevented. For example, if an arrangement in which a metal silicide film comes into contact with the dielectric film 75, metal, such as heavy metal and the like, enters the dielectric film 75, whereby the performance of the dielectric film 75 is deteriorated. Further, in the formation of the capacitance lines 300 on the dielectric films 75, when the capacitance lines 300 are formed continuously without executing a photoresist process after the dielectric films 75 are formed, the quality of the dielectric films 75 can be increased, whereby the dielectric films 75 can be formed thin and finally the capacitances of the storage capacitors 70 can be increased.

As shown in FIGS. 2 and 3, each data line 6a is connected to a transiting and connecting transit layer 71b through a contact hole 81, and further the transit layer 71b is electrically connected to the heavily doped source region 1d, which is formed of, for example, a polysilicon film, of the semiconductor layer 1a. The transit layer 71b is formed of the same film as that of the transit layer 71a having the above-mentioned functions.

Further, each capacitance line 300 extends from the image display region in which the pixel electrode 9a is disposed to the periphery thereof, is electrically connected to a constant potential source, and set to a fixed potential. This will be described below in detail with reference to FIGS. 8 and 9.

Each pixel electrode 9a is electrically connected to the heavily doped drain region 1e of each semiconductor layer 1a through the transit layer 71a as well as the contact holes 83 and 85. More specifically, in this embodiment, the transit layer 71a achieves a function for transiting and connecting the pixel electrodes 9a to the TFTs 30, in addition to the function as the pixel potential side capacitance electrode of the storage capacitor 70 and the function as the light absorption layer. When the transit layers 71a and 71b are used as the transit layers, even if the interlayer distance therebetween is set to a long distance of, for example, about 2000 nm, the transit layers 71a and 71b can be excellently connected to each other through at least two series contact holes each having a relatively small diameter while avoiding a technical difficulty of connecting them through one contact hole, which can increase the opening ratio of the pixels and is useful to prevent etching from passing through contact holes when they are opened.

In FIGS. 2 and 3, the electro-optical device includes the transparent TFT array substrate 10 and the transparent confronting substrate 20 disposed in confrontation with the TFT array substrate 10. The TFT array substrate 10 is formed of, for example, a quartz substrate, a glass substrate, or a silicon substrate, and the confronting substrate 20 is formed of, for example, a glass substrate or a quartz substrate.

The TFT array substrate 10 has grooves 10CV formed thereon which have a lattice shape when observed on a plan view (shown by a region of oblique lines inclining downward in the right direction). The wiring and the elements, such as the scanning lines 3a, the data lines 6a, the TFTs 30, and the like, are buried in the grooves 10CV. This arrangement eases the steps between the regions where the wiring, the elements and the like exist and the regions where they do not exist, so that defective images, such as faulty orientation of liquid crystal, and the like, caused by the steps can finally be reduced.

As shown in FIG. 3, the pixel electrode 9a is disposed on the TFT array substrate 10, and an orientation film 16, having been subjected to predetermined orientation processing, such as rubbing processing or the like, is disposed above the pixel electrode 9a. The pixel electrode 9a is formed of a transparent conductive thin film such as an ITO (indium tin oxide) film or the like. Further, the orientation film 16 is formed of, for example, an organic film such as a polyimide film or the like.

In contrast, a confronting electrode 21 is disposed on the entire surface of the confronting substrate 20, and an orientation film 22 having been subjected to predetermined orientation processing such as rubbing processing or the like is disposed under the confronting electrode 21. The confronting electrode 21 is formed of a transparent conductive film, such as an ITO film or the like. Further, the orientation film 22 is formed of an organic film, such as a polyimide film or the like.

A shading film of a lattice shape or a stripe shape may be disposed on the confronting substrate 20. The shading film on the confronting substrate 20 can more reliably prevent incident light beams from entering the channel regions 1a', the lightly doped source regions 1b and the lightly doped drain regions 1c from the confronting substrate 20 side in cooperation with the capacitance lines 300 and the data lines 6a which constitute the shading film as described above. Further, when at least the surface, to which incident light beams are irradiated, of the shading film on the confronting substrate 20 is formed of a highly reflective film, the shading film acts to prevent an increase in the temperature of the electro-optical device. It is preferable that the shading film on the confronting substrate 20 be formed inwardly of the shading layer formed of the capacitance lines 300 and the data lines 6a when observed in plan view. With this arrangement, an effect of shading light beams and preventing a temperature increase can be obtained by the shading film on the confronting substrate 20 without reducing the opening ratio of the respective pixels.

A liquid crystal layer 50 is formed by inserting liquid crystal as an example of an electro-optical substance in the space surrounded by a seal member, to be described below, between the TFT array substrate 10 and the confronting substrate 20, which are arranged as described above and disposed so that the pixel electrode 9 faces the confronting electrode 21. The liquid crystal layer 50 is placed into a predetermined orientation state by the orientation films 16 and 20 in a state in which no electric field is applied thereto from the pixel electrodes 9a. The liquid crystal layer 50 is formed of liquid crystal with which nematic liquid crystals of, for example, one or a plurality of kinds are mixed. The seal member is an adhesive formed of, for example, a photo-curing or thermosetting resin for bonding the TFT array substrate 10 to the confronting substrate 20 around the peripheries thereof, and a gap agent, such as glass fiber, glass beads, or the like, is mixed therewith to set the distance between both the substrates to a predetermined value.

Further, an underlayer insulation film 12 is disposed under the pixel switching TFT 30. The underlayer insulation film 12, which is formed on the entire surface of the TFT array substrate 10, has a function for preventing the characteristics of the pixel switching TFT 30 from being deteriorated by the surface of the TFT array substrate 10 which is made rough in polishing and by the stain and the like remaining after the TFT array substrate 10 is washed, in addition to a function for interlayer-insulating the TFT 30 from the lower shading film 11a.

In FIG. 3, the pixel switching TFT 30 has a LDD (lightly doped drain) structure and includes the scanning line 3a, the channel region 1a' of the semiconductor layer 1a to which a channel is formed by an electric field from the scanning line 3a, an insulation thin film 2 including a gate insulation film for insulating the scanning line 3a and the semiconductor layer 1a, the lightly doped source and drain regions 1b and 1c of the semiconductor layer 1a, and the heavily doped source and drain regions 1d and 1e thereof.

A first interlayer insulation film 41, to which the contact hole 82 connecting to the heavily doped source region 1d and the contact hole 83 connecting to the heavily doped drain region 1e are formed, respectively, is formed on the scanning line 3a.

The transit layers 71a and 71b and the capacitance line 300 are formed on and above the first interlayer insulation film 41, and a second interlayer insulation film 42, to which the contact holes 82 and 85 connecting to the transit layers 71a and 71b, respectively, is formed thereon and thereabove.

In this embodiment, the ions implemented into the polysilicon films constituting the semiconductor layer 1a and the scanning line 3a may be activated by baking the first interlayer insulation film 41 at 1000° C. In contrast, the stress generated in the vicinity of the interface of the capacitance line 300 may be eased by not subjecting the second interlayer insulation film 42 to the baking.

The data lines 6a is formed on the second interlayer insulation film 42, and a third interlayer insulation film 43, to which the contact hole 85 connecting to the transit layer 71a is formed, is formed thereon. The pixel electrode 9a is formed on the upper surface of the third interlayer insulation film 43 arranged as described above.

The light absorption layers 72 and 71a are formed of a material the light absorption property of which is higher than that of the underlayer insulation film 12 and the respective interlayer insulation films 41, 42, and 43.

According to this embodiment arranged as described above, when light beams tend to be incident on the channel region 1a' of the TFT 30 and its vicinity from the confronting substrate 20 side, the light beams are shaded with the lattice-shaped shading layer formed of the data line 6a and the capacitance line 300 (in particular, the second film 73 thereof). In contrast, when return light beams tend to be incident on the channel region 1a' of the TFT 30 and its vicinity from the TFT array substrate 10 side, the light beams are shaded with the lower shading film 11a (which is effective in particular when one optical system is arranged by a combination of a plurality of electro-optical devices through a prism and the like in a double-panel type color display projector and the like, because return light beams formed of a projected light component passing through the prism and the like from other electro-optical device is strong). Then, internally-reflected light beams, multipath-reflected light beams and the like, which are generated by oblique return light beams incident on the data line 6a formed of the Al film having the high reflectance and on the inner surface of the second film 73 (that is, the surface thereof facing the TFT 30), are absorbed and removed by the first film 72 and the transit layer 71a acting as the light absorption layers. As a result, the characteristics of the TFT 30 are hardly deteriorated by light leakage, and a very high light resistant property can be obtained in the electro-optical device.

In particular, in this embodiment, since the first film 72 and the transit layer 71a acting as the light absorption layers are formed of the polysilicon film made conductive (or a silicon film such as amorphous silicon or the like) and the channel region also is formed of the polysilicon film to which any of P, B, As and the like is doped to control a threshold voltage Vth or to which none of them is not doped (or a silicon film such as amorphous silicon or the like), the light absorption layers have a light absorbing property similar to, or the same as, the light absorbing property (frequency dependent property and the like) in the channel region. Therefore, this arrangement is advantageous in that light beams including a frequency component, which acts as a cause of light leakage when it is absorbed by the channel region 1a', are absorbed and removed by the first film 72 and the transit layer 71a. That is, the effect of a light absorbing property is increased by forming the TFT channel and the light absorption layers of the same main material.

Figure 4:
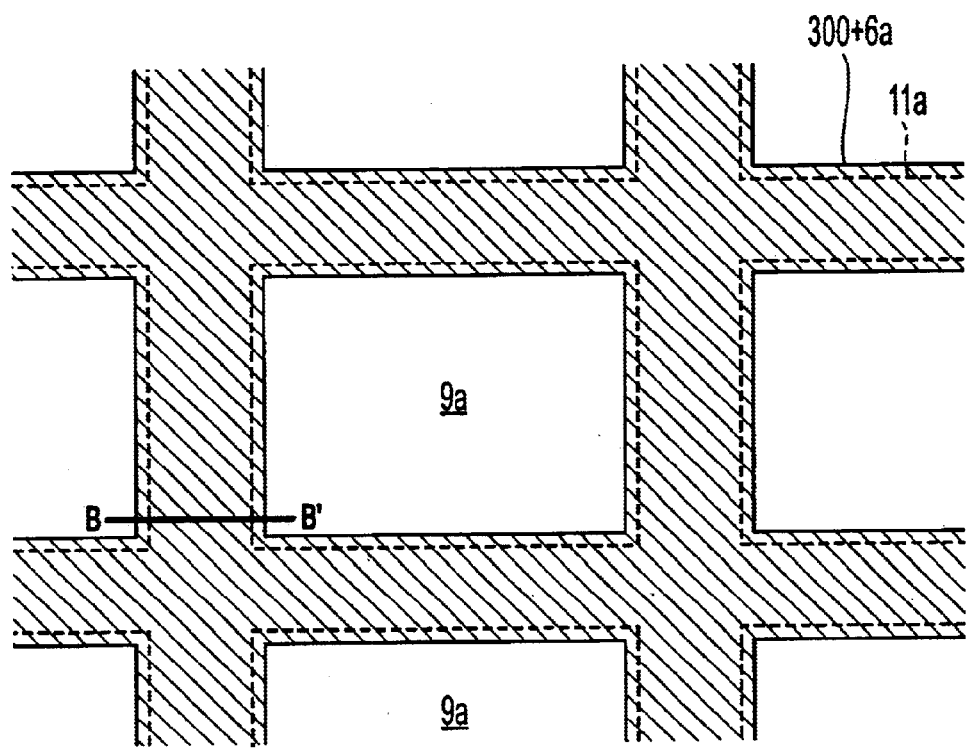
FIG. 4 is a plan view of a pixel of a TFT array substrate in the embodiment from which an upper layer shading film and a lower layer shading film are extracted and shown.
Figure 5:
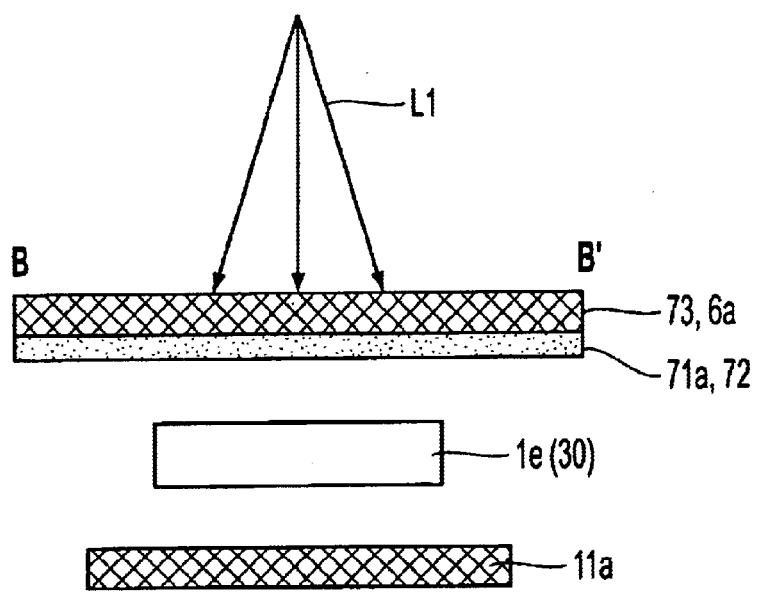
FIG. 5 is a pictorial sectional view showing how light beams are shaded and absorbed in the B–B' section of FIG. 4.
Figure 6:
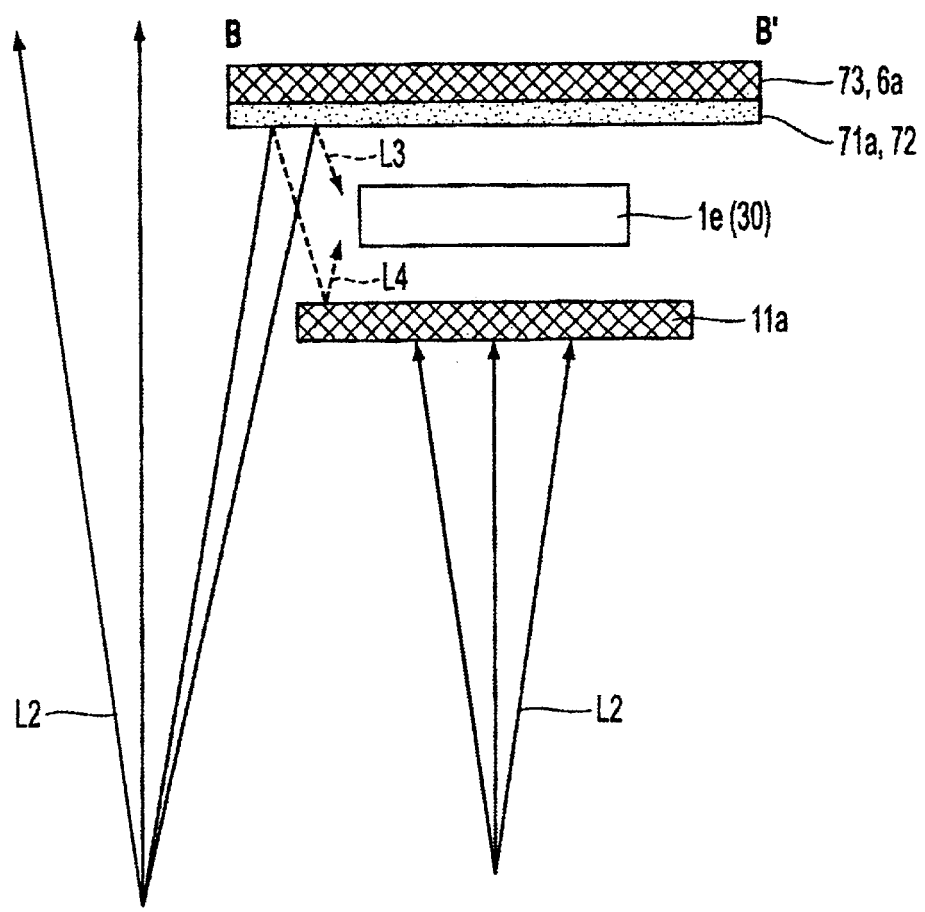
FIG. 6 is a pictorial sectional view showing how light beams are shaded and absorbed in the B–B' section of FIG. 4.
Figure 7:
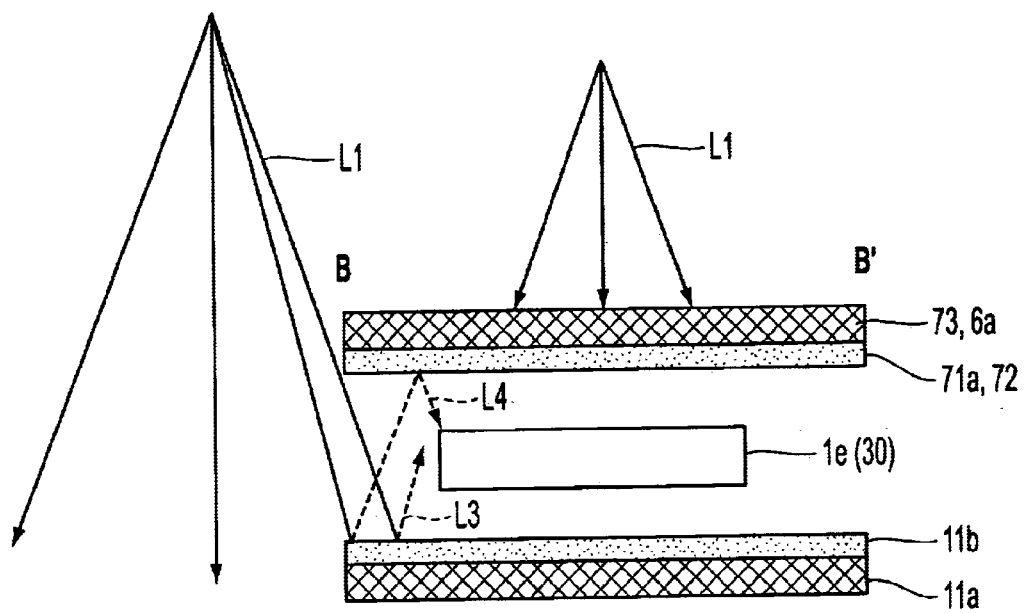
FIG. 7 is a pictorial sectional view showing how light beams are shaded and absorbed in the B–B' section of FIG. 4 in a modified embodiment.

Next, shading and light absorption executed in this embodiment will be further described with reference to FIGS. 4 to 7. FIG. 4 is a pictorial plan view showing the upper and lower shading films in the image display region by extracting and enlarging them, and FIGS. 5 and 6 are pictorial sectional views showing how light beams are shaded and absorbed in the B–B' section of FIG. 4. Further, FIG. 7 is a pictorial sectional view showing how light beams are shaded and absorbed in the same B–B' section of FIG. 4 in a modified embodiment.

As shown in FIG. 4, in this embodiment, the non-opening region of the respective pixels is prescribed in a lattice shape by the shading layer formed of the capacitance lines 300 and the data lines 6a (at the positions where the capacitance lines 300 are discontinued to form the contact holes 81 and 82). Accordingly, these capacitance lines 300 and data lines 6a can effectively prevent a contrast ratio from being lowered by the occurrence of light leakage. These capacitance lines 300 and data lines 6a are disposed above the TFTs 30 in a lattice shape and the lower shading film 11a disposed in a lattice shape is located below the TFTs 30, and the region where the lower shading film 11a is formed is located within the region where the lattice-shaped shading layer composed of the capacitance line 300 and the data line 6a is formed.

Thus, as shown in FIG. 5, the second film 73 of the capacitance line 300 and the data line 6a act as a shading layer with respect to incident light beams L1 which are incident from the upper side in the electro-optical device (that is, from the incident side of the incident light beams). Accordingly, the incident light beams L1 can be prevented from reaching the TFT 30. Further, the lower shading film 11a is formed slightly smaller than the upper shading layer (that is, the second film 73 of the capacitance line 300 and the data line 6a), which reduces the occurrence of internally-reflected light beams and multipath-reflected light beams which result from that the oblique component contained in the incident light beams L1 passes aside the upper shading layer (capacitance line 300 and data line 6a) and is reflected by the inner surface of the lower shading film 11a.

In contrast, as shown in FIG. 6, the lower shading film 11a acts as a shading layer with respect to return light beams L2 which are incident from the lower side in the electro-optical device (that is, from the side from which incident light beams emerge). Accordingly, the return light beams L2 can be prevented from reaching the TFTs 30. Further, since the lower shading film 11a is formed slightly smaller than the upper shading layer (that is, the second film 73 of the capacitance line 300 and the data line 6a), the oblique component contained in the return light beams L2 partly passes aside the lower shading film 11a and advances toward the inner surface of the upper shading layer (in particular, toward the inner surface of the capacitance line 300). However, since the light absorption layers (that is, the first film 72 of the capacitance line 300 and the transit layer 71a) are interposed between the upper shading layer (that is, the second films 73 of the capacitance line 300 and the data line 6a) and the TFT 30, the oblique component contained in the return light beams L2 as well as inner-surface-reflected light beams L3 and multipath-reflected light beams L4 which are caused by that the above component is reflected by the inner surface of the upper shading layer (that is, the second film 73 of the capacitance line 300 and the data line 6a) are absorbed and removed by the light absorption layers.

From a result of the above-mentioned structure, deterioration of the pixel switching TFTs 30 caused by light leakage can be reduced by increasing a light resistant property while increasing the opening ratio of the respective pixels by the embodiment, which finally permits a bright image of high quality having a high contrast ratio to be displayed.

In the embodiment, it is preferable that the second film 73 constituting the shading layer have a heat conductivity which is higher than that of the first film 72 and the transit layer 71a constituting the light absorption layers. Accordingly, the heat generated in the first film 72 and the transit layer 71a when they absorb light beams can escape through the second film 73 having the higher heat conductivity. That is, the quantity of heat transmitted to the TFTs 30 from the first film 72 and the transit layer 71a can be reduced, whereby the heat leakage caused by the TFTs 30 can be reduced. As a result of the above mentioned, the transistor characteristics of the TFTs 30 can be greatly enhanced by reducing both the light leakage and the heat leakage.

Further, from the view point of reducing the heat leakage of the TFT 30, it is preferable that the first interlayer insulation film 41 interposed between the transit layer 71a acting as the light absorption layer and the TFT 30 be set larger than the dielectric film 75 interposed between the transit layer 71a and the capacitance line 300 having the function for escaping heat as described above. When the first interlayer insulation film 41 is set as described above, the heat generated by the transit layer 71a when it absorbs light beams can more effectively escape through the capacitance line 300.

In the embodiment shown in FIGS. 4 to 6, since the lower shading film 11a is formed slightly smaller than the upper shading layer (that is, the second film 73 of the capacitance line 300 and the data line 6a) it is difficult for the oblique component contained in the incident light beams L1 to reach the inner surface of the lower shading film 11a. However, the inner-surface-reflected light beams and the multipath-reflected light beams, which are caused by the obliquely incident light beams L1 reflected by the inner surface of the lower shading film 11a, become a problem depending upon the specification of the device (for example, depending on a degree of reduction of the size of the lower shading film 11a and on a degree of oblique angle applied to the incident light beams).

In this case, it is sufficient to dispose a light absorption layer 11b also on the inner surface of the lower shading film 11a, as shown in a modified embodiment shown in FIG. 7. With this arrangement, it is possible for the light absorption layer 11b to absorb and remove the obliquely incident light beams L1 reaching the inner surface of the lower shading film 11a as well as the inner-surface-reflected light beams L3 and the multipath-reflected light beams L4 resulting from the obliquely incident light beams L1. It is preferable that a main material which forms the light absorption layer 11b is the same as that for forming the channel region.

Figure 8:
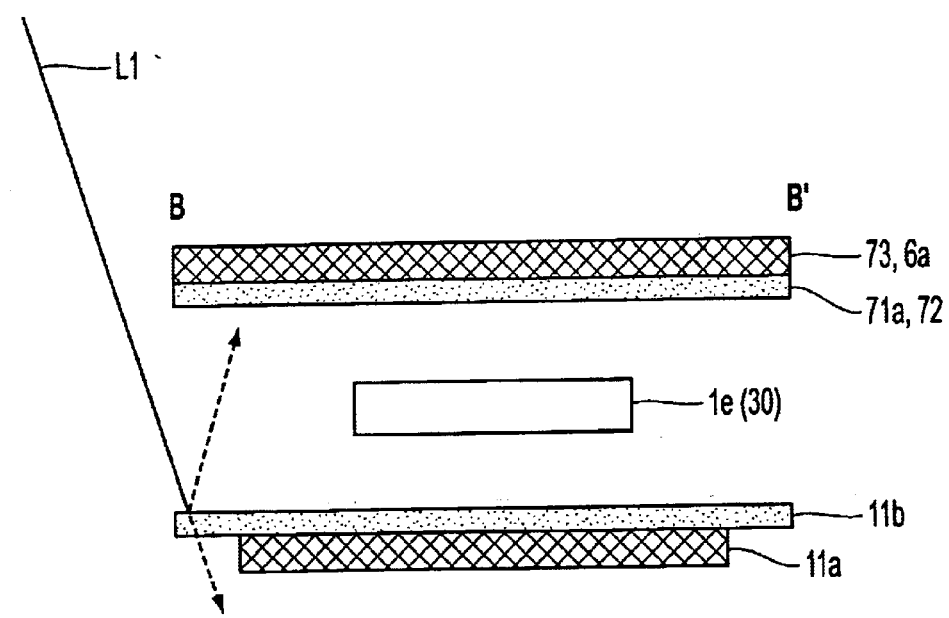
FIG. 8 is a pictorial sectional view showing how light beams are shaded and absorbed in the B–B' section of FIG. 4 in another modified embodiment.

Further, as another modified embodiment, a modified embodiment shown in FIG. 8 may be employed. The lower shading film 11a is formed inwardly of the upper shading films 73 and 6a, and the lower light absorption layer 11b is formed wider than the lower shading film 11a. With this arrangement, the obliquely incident light beams L1 can be absorbed and removed by the lower absorption layer 11b or the upper absorption layers 71a and 72. Further, since the obliquely incident light beams L1 having passed through the lower absorption layer 11b can pass therethrough without being reflected by the lower shading film 11a, they do not reach the semiconductor layers of the TFT 30.

In the modified embodiment of FIG. 8, while the lower absorption layer 11b is shown as being approximately as wide as the upper absorption layers 71a and 72, it may be formed inwardly of the upper absorption layers 71a and 72 or may be formed wider than them.

Figure 9:
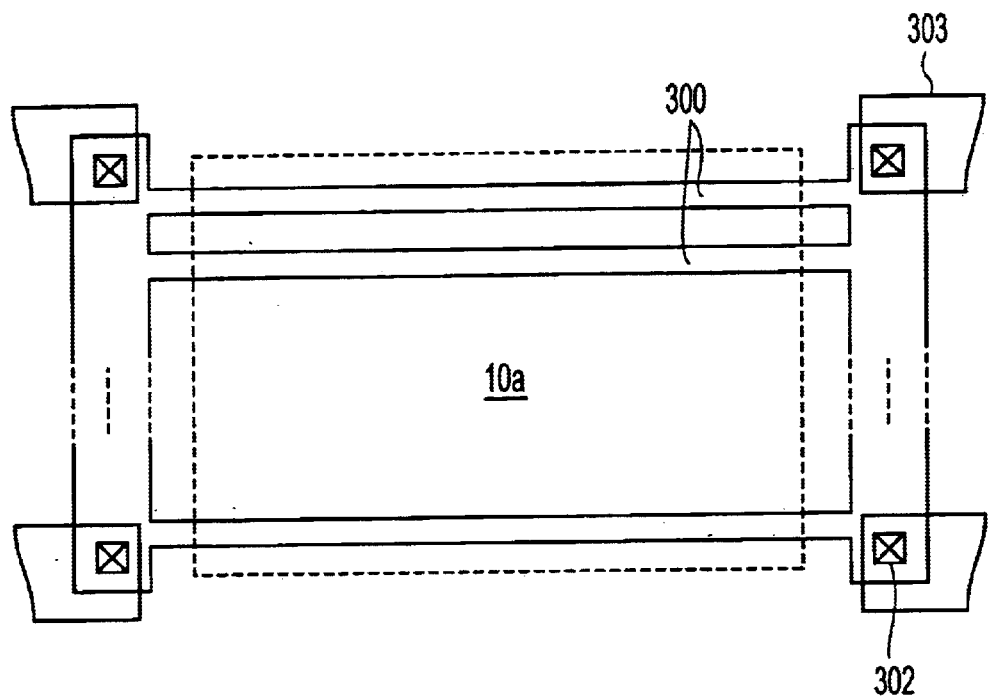
FIG. 9 is a plan view showing an example of an arrangement in which capacitance lines 300 are connected to a constant potential source.

Next, an arrangement in which the capacitance lines 300 are used as a fixed potential will be described with reference to FIGS. 9 and 10. FIG. 9 is a plan view showing an example of an arrangement in which capacitance lines 300 are connected to a constant potential source, and FIG. 10 is a plan view showing another example of the arrangement in which the capacitance lines 300 are connected to the constant potential source.

Figure 10:
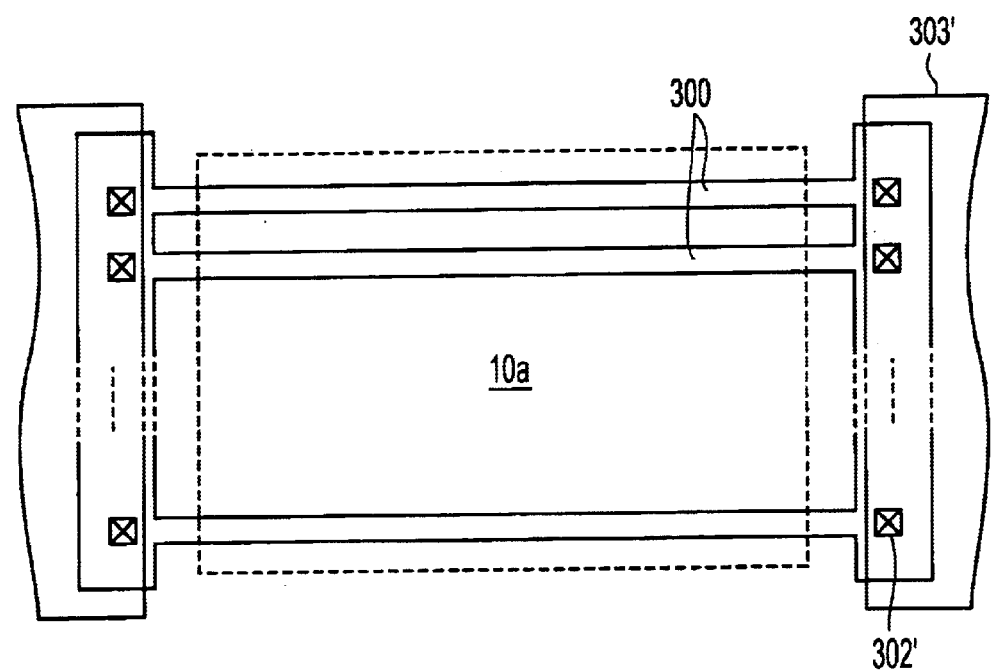
FIG. 10 is a plan view showing another example of the arrangement in which the capacitance lines 300 are connected to the constant potential source.

As shown in FIGS. 9 and 10, the capacitance lines 300, which are formed approximately in a stripe shape in an image display region 10a, preferably extend to a peripheral region located in the periphery of the image display region 10a so that they are arranged as a single unit. Then, the capacitance lines 300 may be connected to, for example, constant potential wiring 303 as a whole through the contact holes 302 disposed at the four corners of the TFT array substrate 10, as shown in FIG. 9. Otherwise, they may be connected to constant potential wiring 303' through a plurality of contact holes 302' disposed redundantly as shown in FIG. 10. Note that in FIGS. 9 and 10, the constant potential wiring 303 and 303' is preferably formed of an Al film having a low resistance similarly to the data lines 6a.

Further, a constant potential source, to which the constant potential wiring 303 and 303' is connected, may be a constant potential source acting as a positive power supply or a negative power supply which is supplied to a scanning line drive circuit (to be described below) to supply a scanning signal for driving the TFTs 30 to the scanning lines 3a or to a data line drive circuit (to be described later) to control a sampling circuit that supplies an image signal to the data lines 6a. Otherwise, the constant potential source may be a constant potential source supplied to the confronting electrodes 21 of the confronting substrate 20.

It is preferable to extend the lower shading film 11a disposed below the TFTs 30 from the image display region to its periphery similarly to the capacitance lines 300 and to connect the lower shading film 11a to the constant potential source to avoid that the variation of potential thereof adversely affects the TFTs 30.

In the embodiment described above, the occurrence of steps, which would be formed in the regions along the data lines 6a and the scanning lines 3a on the underlayer surface of the pixel electrodes 9a (that is, on the surface of the third interlayer insulation film 43) by laminating the plurality of conductive layers as shown in FIG. 3, is eased by forming the grooves 10cv on the TFT array substrate 10. In place of or in addition to the grooves 10CV, however, flattening processing may be executed by forming grooves on the underlayer insulation film 12, the first interlayer insulation film 41, the second interlayer insulation film 42, and the third interlayer insulation film 43 and by burying the wiring such as the data lines 6a and the like, the TFTs 30 and so on. Otherwise, the flattening processing may be executed by polishing the steps on the upper surfaces of the third and second interlayer insulation films 43 and 42 by means of CMP (chemical mechanical polishing) or the like or by flattening them using organic SOG.

Further, in the above-mentioned embodiment, while the pixel switching TFT 30 preferably has the LDD structure as shown in FIG. 3, it may have an offset structure in which no impurity is implanted into the low concentration source and drain regions 1b and 1c or may be arranged an self-alignment type TFT in which impurities are implanted in a high concentration using the gate electrodes formed of a part of the scanning lines 3a as masks so as to form a high concentration source and drain regions in a self-alignment fashion. Further, while this embodiment is arranged as a single gate structure in which only one gate electrode of the pixel switching TFT 30 is interposed between the high concentration source and drain regions 1d and 1e, at least two gate electrodes may be interposed therebetween. When the TFT is arranged with the dual gates or at least with the triple gates, the leakage current at the joints of the channel, source and drain regions can be reduced or prevented, whereby a current can be reduced when the TFT is turned off.

(Overall Arrangement of Electro-Optical Device)

Figure 11:
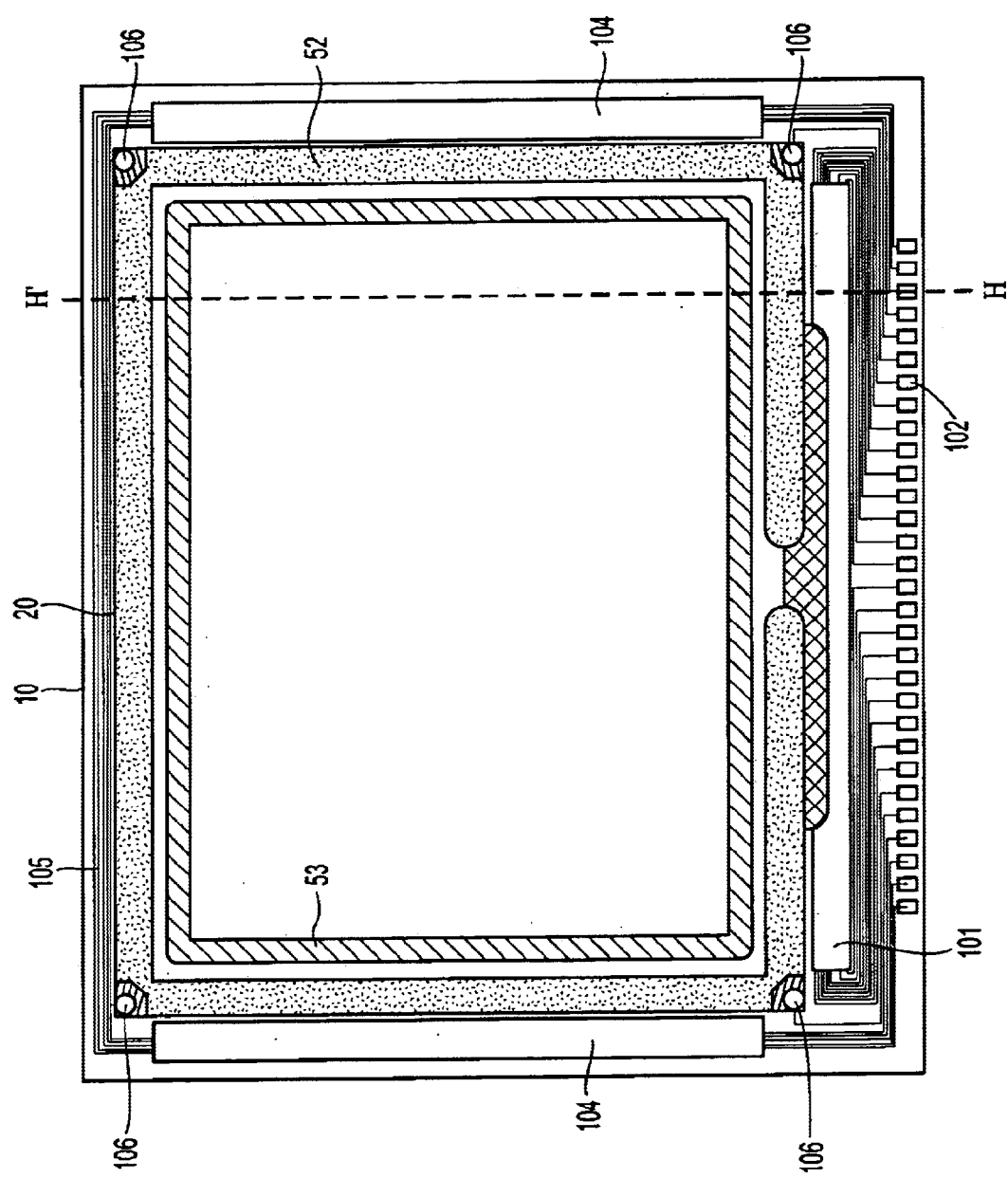
FIG. 11 is a plan view of the TFT array substrate in the electro-optical device of the embodiment as viewed from a confronting substrate side together with the respective constitutional elements formed thereon.

An overall arrangement of the electro-optical device in the respective embodiments constructed as described above will be described with reference to FIGS. 11 to 12. Note that FIG. 11 is a plan view in which the TFT array substrate 10 is viewed from the confronting substrate 20 side together with the respective constitutional elements formed thereon, and FIG. 12 is a sectional view taken along plane H–H' of FIG. 11.

Figure 12:
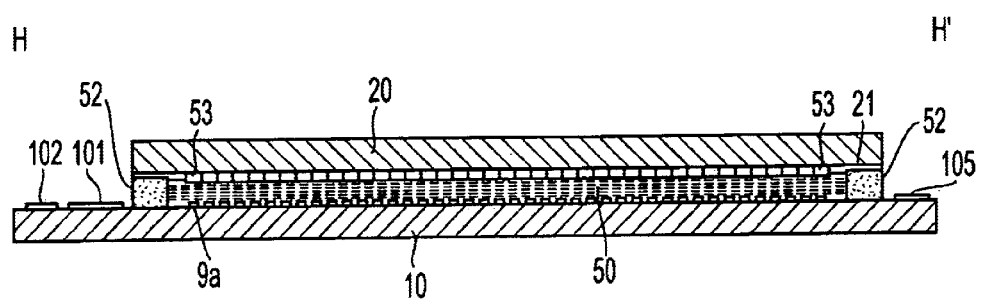
FIG. 12 is a sectional view taken along plane H–H' of FIG. 11.

In FIG. 12, a seal member 52 is disposed on the TFT array substrate 10 along the edge thereof and a shading film 53, which acts as a frame for prescribing the periphery of the image display region 10a, is disposed inwardly of the seal member 52 in parallel therewith. A data line drive circuit 101 for driving the data lines 6a by supplying an image signal thereto at predetermined timing and an external circuit connecting terminals 102 are disposed along one side of the TFT array substrate 10 in a region outside of the seal member 52, and scanning line drive circuits 104 are disposed along two sides of the TFT array substrate 10 adjacent to the one side thereof to drive the scanning lines 3a by supplying a scanning signal thereto at predetermined timing. A scanning line drive circuit 104 may be disposed on only one side of the TFT array substrate 10 if no problem is caused by delay of a scanning signal to be supplied to the scanning lines 3a. Further, data line drive circuits 101 may be disposed along both sides of the image display region 10a. Further, a plurality of pieces of wiring 105 are disposed along the remaining one side of the TFT array substrate 10 to connect the scanning line drive circuits 104 disposed on both the sides of the image display region 10a. Further, a conductor 106 is disposed to at least one of the corners of the confronting substrate 20 to make electric conduction between the TFT array substrate 10 and the confronting substrate 20. Then, as shown in FIG. 12, the confronting substrate 20, which has substantially the same outline as that of the seal member 52 shown in FIG. 11, is secured to the TFT array substrate 10 by the seal member 52.

A sampling circuit that applies an image signal to the plurality of data lines 6a at predetermined timing, a precharge circuit that supplies a precharge signal of a predetermined voltage level to the plurality of data lines 6a prior to the image signal, an inspection circuit that inspects the quality, defect and the like of the electro-optical device while it is being manufactured or when it is shipped, and the like may be formed on the TFT array substrate 10, in addition to the data line drive circuit 101, the scanning line drive circuits 104 and the like.

In the embodiments described with reference to FIGS. 1 to 12, the data line drive circuit 101 and the scanning line drive circuits 104 may be electrically and mechanically connected to a driving LSI mounted on, for example, a TAB (tape automated bonding) substrate through an anisotropic conductive film disposed to the periphery of the TFT array substrate 10 in place of that they are disposed on the TFT array substrate 10. Further, a polarizing film, a phase difference film, a polarizer, and the like are disposed on the side of the confronting substrate 20 on which projected light beams are incident and on the side of the TFT array substrate 10 from which light beams emerge depending upon operation modes, for example, a TN mode, a VA (vertically aligned) mode, a PDLC (polymer dispersed liquid crystal) mode, and the like and depending on a normally white and a normally black mode.

The electro-optical device of the embodiments described above is applied to a projector as, for example, a light bulb.

Figure 13:
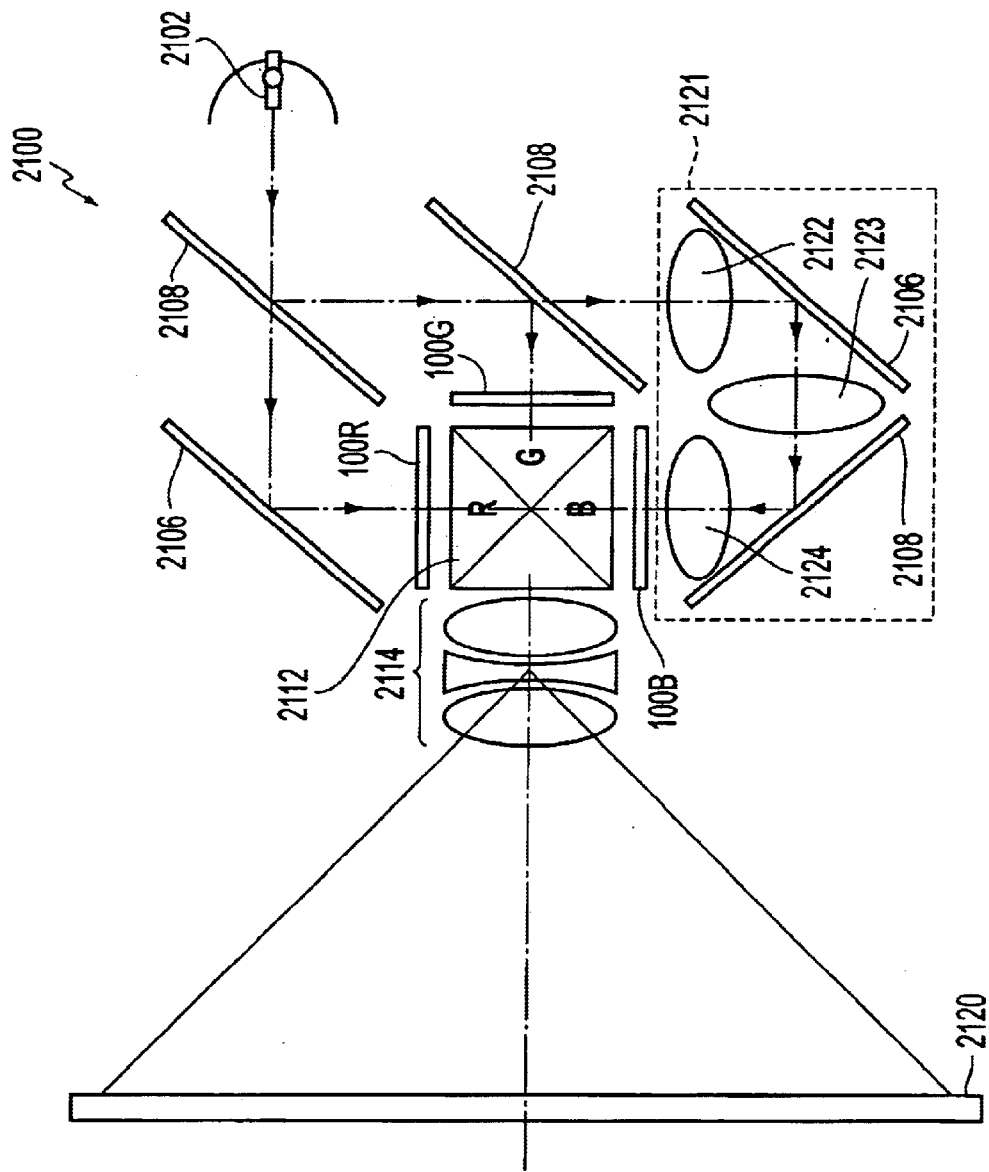
FIG. 13 is a plan view showing an arrangement of a projector.

FIG. 13 is a plan view showing an arrangement of the projector. As shown in FIG. 13, a lamp unit 2102, which is formed of a white light source, such as a halogen lamp, is disposed in the projector 2100. Projected light beams emitted from the lamp unit 2102 are separated into three primary colors of RGB by three mirrors 2106 and two dichroic mirrors 2108 disposed in the projector 2100 and introduced to light bulbs 100R, 100G, and 100B corresponding to the respective primary colors, respectively. The light bulbs 100R, 100G, and 100B are arranged similarly to a liquid crystal panel 100 according to the above-mentioned embodiments and driven in response to primary color signals of R, G, B supplied from a processing circuit (not shown) to which an image signal is inputted, respectively. Further, since light beams of B color have a longer light path as compared with other light beams of R color and G color, they are introduced through a relay lens system 2121 composed of an incident light lens 2122, a relay lens 2123, and a light emitting lens 2124.

Incidentally, the light beams, which have been modulated by the light bulbs 100R, 100G and 100B, respectively, are incident on a dichroic prism 2112 from three directions. Then, the light beams of R and B colors are refracted at 90° by the dichroic prism 2112, whereas the light beams of G color advance straight. Therefore, after the images the respective colors are combined, a color image is projected on a screen 2120 by a projecting lens 2114.

Note that since light beams corresponding to the respective primary colors of R, G, and B are incident on the light bulbs 100R, 100G, and 100B through the dichroic mirrors 2108, a color filter need not be provided therewith. Further, the images having passed through the light bulbs 100R and 100B are projected after they are reflected by the dichroic prism 2112, whereas the image having passed through the light bulb 100G is projected as it is. Thus, the images displayed by the light bulbs 100R and 100B are reversed laterally with respect to the image displayed by the light bulb 100G.

In the above-mentioned embodiments, no color filter is provided with the confronting substrate 20. However, RGB color filters may be formed on the confronting substrate 20 in predetermined regions confronting the pixel electrodes 9a together with the protective films thereof. With this arrangement, the electro-optical device of the respective embodiments can be applied to a direct-observing type or reflecting type color electro-optical device, in addition to the projector.

Further, microlenses may be formed on the confronting substrate 20 so that one microlens corresponds to one pixel. Otherwise, color filter layers formed of a color resist or the like may be formed under the pixel electrodes 9a corresponding to RGB on the TFT array substrate 10. With this arrangement, a bright electro-optical device can be realized by enhancing an incident light converging efficiency. Further, a dichroic filter for creating RGB colors making use of light interference may be formed by depositing several interference layers having a different refractive index on the confronting substrate 20. According to the confronting substrate provided with the dichronic filter, a brighter electro-optical device can be realized.

The electro-optical device of the present invention can be applied to the display device of a mobile type personal computer and the display device of a mobile phone as well as to a liquid crystal television, view-finder type and monitor-direct-observing type video tape recorders, car navigation device, pager, electronic notebook, electronic calculator, word processor, workstation, TV phone, POS terminal, digital still camera, electronic equipment provided with a touch panel, and the like as other application examples.

The present invention is by no means limited to the above-mentioned embodiments and can be suitably modified within a range which is not contrary to the gist and spirit of the present invention which are read from the following claims and the overall specification, and it is needless to say that electro-optical devices and methods of manufacturing them that are modified as described above also are included in the technical scope of the present invention.

What is claimed is:

1. An electro-optical device, comprising:
   a pair of substrates;
   an electro-optical substance interposed between the pair of substrates;
   pixel electrodes formed on one of the pair of substrates;
   thin film transistors electrically connected to the pixel electrodes, the thin film transistors having channel regions;
   a first shading layer that is disposed above the thin film transistors and covers at least the channel regions of the thin film transistors;
   a light absorption layer interposed between the first shading layer and the thin film transistors; and
   a second shading layer that is disposed below the thin film transistors, wherein the second shading layer is formed smaller than the light absorption layer when observed on a plan view.

2. The electro-optical device according to claim 1, the light absorption layer substantially including a material which mainly forms the channel regions of the thin film transistors.

3. The electro-optical device according to claim 1, the light absorption layer including a silicon film.

4. The electro-optical device according to claim 1, the first shading layer including a film containing metal.

5. The electro-optical device according to claim 1, the first shading layer including data lines.

6. The electro-optical device according to claim 1, said first shading layer including:
   a plurality of data lines electrically connected to the thin film transistors and extending in a first direction, respectively; and
   a plurality of capacitance lines electrically connected to said pixel electrodes and extending in a second direction intersecting the first direction, respectively.

7. The electro-optical device according to claim 1, the light absorption layer including a portion that includes an intermediate conductor layer that transits and electrically connects the pixel electrodes or said data lines to the thin film transistors.

8. The electro-optical device according to claim 1, the second shading layer covering at least the channel regions of the thin film transistors.

9. The electro-optical device according to claim 8, further comprising another light absorption layer interposed between the second shading layer and the thin film transistors, and substantially including a material which mainly forms the channel regions of the thin film transistors.

10. The electro-optical device according to claim 1, the first shading layer having a heat conductivity higher than that of the light absorption layer.

11. The electro-optical device according to claim 10, an interlayer distance between the thin film transistors and the light absorption layer being larger than that between the light absorption layer and the first shading layer.

12. An electro-optical device, comprising:
    a pair of substrates;
    an electro-optical substance interposed between the pair of substrates;
    pixel electrodes formed on one of the pair of substrates;
    thin film transistors electrically connected to the pixel electrodes, the thin film transistors having channel regions;
    a shading layer that covers at least the channel regions of the thin film transistors; and
    a light absorption layer, interposed between the shading layer and the thin film transistors,
    wherein the shading layer includes capacitance lines interposed between data lines and the thin film transistors,
    the light absorption layer including capacitance electrodes disposed in confrontation with the capacitance lines through a dielectric film and separated in an island shape for each pixel.

13. The electro-optical device according to claim 12, the capacitance lines being formed in a stripe shape extending in a direction intersecting the data lines in an image display region as well as electrically connected to a constant potential source located in a peripheral region located in the vicinity of the image display region.

14. The electro-optical device according to claim 13, the capacitance lines being electrically connected to each other in the peripheral region and electrically connected to said constant potential source as a whole through one or a plurality of contacts.

15. The electro-optical device according to claim 13, said capacitance lines being electrically connected to each other in the peripheral region and redundantly connected to said constant potential source through a plurality of contacts.

16. An electro-optical device, comprising:
a pair of substrates;
an electro-optical substance interposed between the pair of substrates;
pixel electrodes formed on one of the pair of substrates;
thin film transistors electrically connected to the pixel electrodes, the thin film transistors having channel regions;
a shading layer that covers at least the channel regions of the thin film transistors; and
a light absorption layer interposed between the shading layer and the thin film transistors, wherein
the shading layer includes one layer of capacitance lines interposed between data lines and the thin film transistors and having a multilayer structure,
the light absorption layer including another layer of the capacitance lines that is located nearer to the thin film transistors than the one layer.

17. An electro-optical device, comprising:
a pair of substrates;
an electro-optical substance interposed between the pair of substrates;
pixel electrodes formed on one of the pair of substrates;
thin film transistors electrically connected to the pixel electrodes, the thin film transistors having channel regions;
a shading layer that covers at least the channel regions of the thin film transistors; and
a light absorption layer interposed between the shading layer and the thin film transistors,
wherein the shading layer is laminated on the light absorption layer through an insulation film as well as formed slightly larger than the light absorption layer when observed on a plan view.

18. An electro-optical device, comprising:
a pair of substrates;
an electro-optical substance interposed between the pair of substrates;
pixel electrodes formed on one of the pair of substrates;
thin film transistors electrically connected to the pixel electrodes, the thin film transistors having channel regions;
a first shading layer that covers at least the channel regions of the thin film transistors; and
a first light absorption layer facing the first shading layer through the thin film transistors.

19. The electro-optical device according to claim 18, the first shading layer being disposed on a light incident side with respect to the thin film transistors.

20. The electro-optical device according to claim 18, a second light absorption layer being further interposed between the first shading layer and the thin film transistors.

21. A projecting type display device, comprising:
a light source;
an electro-optical device according to claim 18;
light conductors that introduce light beams emitted from the light source to electro-optical device; and
a projecting optical member that projects light beams modulated by the electro-optical device.

22. The electro-optical device according to claim 18, a second shading layer being further disposed on a side opposite to the first light absorption layer with respect to the thin film transistors.

23. The electro-optical device according to claim 22, the second shading layer being formed in a region inside of the first light absorption layer.

24. The electro-optical device according to claim 23, the second shading layer being formed in a region inside of the first shading layer.

25. An electro-optical device, comprising:
a pair of substrates;
an electro-optical substance interposed between the pair of substrates;
pixel electrodes formed on one of the pair of substrates;
thin film transistors electrically connected to the pixel electrodes, the thin film transistors having channel regions;
a first light absorption layer that covers at least the channel regions of the thin film transistors; and
a second light absorption layer facing the first light absorption layer through the thin film transistors.

26. The electro-optical device according to claim 25, further including light transmitting insulation films interposed among the pixel electrodes, the thin film transistors, and the first light absorption layer, respectively.

27. A substrate for electro-optical device, comprising:
pixel electrodes;
thin film transistors electrically connected to the pixel electrodes;
a first shading layer that is disposed above the thin film transistor, and covers at least the channel regions of the thin film transistors;
a light absorption layer interposed between the first shading layer and the thin film transistors; and
a second shading layer that is disposed below the thin film transistor, wherein the second shading layer is formed smaller than the light absorption layer when observed on a plan view.

28. A substrate for electro-optical device, comprising:
pixel electrodes;
thin film transistors electrically connected to the pixel electrodes, the thin film transistors having channel regions;
a shading layer that covers at least the channel regions of the thin film transistors; and
a light absorption layer facing said shading layer through the thin film transistors.

29. A substrate for electro-optical device, comprising:
pixel electrodes;
thin film transistors electrically connected to the pixel electrodes, the thin film transistors having channel regions;
a first light absorption layer that covers at least the channel regions of the thin film transistors; and
a second light absorption layer facing the first light absorption layer through the thin film transistors.

* * * * *